United States Patent [19]

Van Houdt et al.

[11] Patent Number: 5,583,811
[45] Date of Patent: Dec. 10, 1996

[54] TRANSISTOR STRUCTURE FOR ERASABLE AND PROGRAMMABLE SEMICONDUCTOR MEMORY DEVICES

[75] Inventors: Jan Van Houdt, Lubbeek; Guido Groeseneken, Leuven; Herman Maes, Bierbeek, all of Belgium

[73] Assignee: Interuniversitair Micro-Elektronica Centrum vzw, Belgium

[21] Appl. No.: 275,016

[22] Filed: Jul. 13, 1994

Related U.S. Application Data

[63] Continuation of Ser. No. 80,225, Jun. 21, 1993, which is a continuation-in-part of Ser. No. 827,715, Jan. 29, 1992, abandoned.

[30] Foreign Application Priority Data

Jan. 31, 1991 [BE] Belgium ............................... 09100091

[51] Int. Cl.$^6$ .................................................. G11C 16/04
[52] U.S. Cl. ............................... 365/185.15; 365/185.09; 365/185.14; 365/185.18
[58] Field of Search ............................. 365/185, 218, 365/185.14, 185.15, 185.18, 185.09

[56] References Cited

U.S. PATENT DOCUMENTS

| | | | |
|---|---|---|---|
| 4,503,519 | 3/1985 | Arakawa | 365/104 |
| 4,608,591 | 8/1986 | Ipri et al. | 357/54 |
| 4,794,565 | 12/1988 | Wu et al. | 365/185 |
| 4,821,236 | 4/1989 | Hayashi et al. | 365/185 |
| 4,996,668 | 2/1991 | Paterson et al. | 365/185.14 |
| 4,998,220 | 3/1991 | Eitan et al. | 365/185.14 |
| 5,034,926 | 7/1991 | Taura et al. | 365/185.14 |
| 5,042,009 | 8/1991 | Kazerounian et al. | 365/185 |
| 5,212,541 | 5/1993 | Bergemont | 257/319 |

FOREIGN PATENT DOCUMENTS

| | | |
|---|---|---|
| 0228761 | 9/1986 | European Pat. Off. . |
| 57-169005 | 9/1982 | Japan . |
| 58-115956 | 6/1983 | Japan . |

OTHER PUBLICATIONS

IEDM, 1988, R. Kazerounian et al., "A 5 Volt High Density Poly–Poly Erase Flash EPROM Cell," IEEE (p. 436).

IEDM, 1987, H. Kume et al., "A Flash–Erase EEPROM Cell with an Asymmetric Source and Drain Structure," IEEE (p. 560).

IEDM, 1986, A. T. Wu et al., "A Novel High–Speed 5–Volt Programming EPROM Structure with Source–Side Injection," IEEE (p. 584).

IEDM, 1980, Masashi Wada et al., "Limiting Factors for Programming EPROM of Reduced Dimensions" (p. 38).

IEEE, 1987, Transactions on Electron Devices, vol. ED–34, No. 12, Dec. 1987, Prall et al., "Characterization and Suppression of Drain Coupling in Submicrometer EPROM Cells" (p. 2463).

*Primary Examiner*—Joseph E. Clawson, Jr.
*Attorney, Agent, or Firm*—Banner & Witcoff, Ltd.

[57] ABSTRACT

A programmable EEPROM cell structure consisting in a split-gate structure in series with a coupling capacitor between the floating gate and an additional program gate in order to provide enhanced injection efficiency. The electron injection is controlled by a control gate at the source side. The area of the coupling capacitor is selected with a substantial coupling factor to a high voltage onto the floating gate during programming so as to produce hot-electron injection at the split point in the channel region between the control gate and the floating gate. Submicrosecond programming at a 5 V drain voltage can thereby be achieved.

3 Claims, 7 Drawing Sheets

1. Vd = 3 V
2. Vd = 4 V
3. Vd = 5 V
4. Vd = 6 V

TRANSISTOR STRUCTURE FOR ERASABLE AND PROGRAMMABLE SEMICONDUCTOR MEMORY DEVICES

RELATED APPLICATION

This is a continuation of application Ser. No. 08/080,225, filed Jun. 21, 1993. Application Ser. No. 08/080,225 is a continuation-in-part of U.S. patent application Ser. No. 07/827,715, filed on Jan. 29, 1992. Application Ser. No. 07/827,715 abandoned claims priority of Belgium application Ser. No. 09100091 filed Jan. 31, 1991.

FIELD OF THE INVENTION

The present invention relates to electrically erasable and programmable semiconductor memory devices (EEPROMs) and in particular to a fast programmable non-volatile EEPROM cell and a method for programming such a device.

BACKGROUND OF THE INVENTION

Nowaday microprocessors require fast programmable and fast readable memory devices (among others EEPROMs). In conventional EPROM memory devices, the programming mechanism is based on a channel hot electron injection mechanism. In order to program a transistor memory cell high voltages should be applied to the gate and the drain of the transistor. This results in a high power consumption to program the device.

Flash memories were devised to combine the higher densities and faster programming techniques of EPROMs with the electrical erasability and in-circuit reprogrammability of EEPROMs. Flash EEPROMs are at present mainly used as a substitute for EPROMs in products where in-circuit reprogrammability is important. The main applications are expected in the field of computers and telecommunication, although also the use in automotive and defence sectors is expected to become more important than today. Moreover, flash EEPROM also has the potential to become the technology of choice for new high volume applications such as solid state disks for portable computers (notebook and palmtop computers), portable phones, memory cards, storage media for cameras, and so on.

Most commercially available flash EEPROMs use Channel Hot Electron Injection (CHEI) for writing and Fowler-Nordheim (FN) tunneling through a thin oxide for erasure, although various alternative programming mechanisms have been proposed and implemented.

In "stacked-gate" devices which are based on ETOX technology, the flash EEPROM transistor is similar to the conventional double polysilicon EPROM structure but it uses a thinner gate oxide and a graded junction at the source to allow electrical erasure. The cell is still programmed with drain voltages larger than 5 V (in 1 µm technology) and therefore requires an external voltage supply.

The high programming voltage and power consumption is a direct consequence of the low injection efficiency which is physically inherent to the conventional CHEI mechanism.

In recent publications, 5 V-only operation of this type of cell has been demonstrated but only from 0.6 µm technologies on. At that point, 3.3 V-only operation should, however, already be considered. On the other hand, soft-write phenomena pose a severe reliability concern in these devices since the margin between the programming and read-out conditions becomes continuously smaller. The advantages of the ETOX cell are the small cell size and the fact that the cell can be implemented in existing EPROM designs and technologies. Indeed, only minor additional processing steps are required with respect to EPROM, while the programming conditions are almost identical to EPROM programming conditions.

Besides the need for an external power supply, the main disadvantages are imposed by overerase problems and short-channel effects such as drain turn-on and punch-through. Unlike the case of EPROM, where the UV-erase process is self-limiting, this is no longer the case when using electrical erasure. Since there is no select transistor present, this leads to severe problems when the device has been overerased to negative threshold voltages. Therefore, time and area consuming adaptive erasing procedures have to be implemented on the chip, which lead to higher design complexity.

A second approach is derived from the split-gate EPROM cell. These cells are again programmed by conventional CHEI at the drain, while erasure occurs either by FN tunneling through a thin oxide or by enhanced tunneling through a polyoxide layer.

The main advantage of this cell is that the presence of the series transistor makes it insensitive to overerase. Additionally, the split-gate structure is less sensitive to typical E(E)PROM short-channel effects. However, it still shows some of the disadvantages of the ETOX-concept, such as the need for an external power supply.

For the polyoxide version, (see, for example, U.S. Pat. No. 5,042,009 issued to Kazerounian et al.) 5 V-only operation has yet been achieved however at the expense of a milli-second-range programming time. In the thin oxide version, it becomes difficult to optimize the drain profile, since a graded profile is needed for erasure and a steep profile is necessary for optimal CHEI conditions. A bottleneck for this device was the fact that program and erase operations are performed at the same channel position, which leads to limited endurance.

Performing the erase operation through a polyoxide layer towards a separate erase gate could in fact remove these last two drawbacks but the polyoxide conduction mechanism requires very high erase voltages which are to be generated on chip and the number of write/erase cycles is known to be very limited. This can be solved by a gradual increase of the erase voltage, leading to even higher voltages.

Finally, in a third approach, a lot of effort has been spent in order to obtain a higher injection efficiency by means of Source Side Injection (SSI) techniques.

U.S. Pat. No. 4,794,565 discloses an alternative transistor structure which allows the programming operation to be performed using a low drain voltage and a high gate voltage. This known device includes an extra polysilicon gate that is located adjacent the stacked dual gate transistor structure above the diffused source region. A high lateral electric field is thereby generated adjacent the source when a high voltage is applied to the gate at the drain side of the device. Said lateral electric field combines with a high vertical field, resulting in a faster programming operation.

The concepts relying on this enhanced CHEI mechanism show a fast 5 V-only operation however at the expense of a considerably higher process complexity, at least in part due to the formation of the additional polysilicon gate. As a result, these devices are rather unsuited for low cost EEPROM technology and embedded applications.

SUMMARY OF THE INVENTION

An object of the present invention is to provide a fast 5 V-only and 3.3 V-only programmable EEPROM cell which combines the advantages of the previous concepts, but without displaying their disadvantages.

Another object of this invention is to provide a method of programming a fast EEPROM cell so as to substantially increase the programming speed.

Yet another object of this invention is to overcome the disadvantages referred to above and to provide a MOS transistor structure that is suitable for being programmed with the aid of a standard TTL supply and that can be manufactured using a standard CMOS technology.

According to the invention there is provided a High Injection MOS (HIMOS) flash EEPROM cell consisting in a split-gate structure and a coupling capacitor between the floating and an additional program gate in order to provide an enhanced injection efficiency, similar to the efficiency which is obtained in Source Side Injection (SSI) devices. The electron injection is controlled by a control gate at the source side and the corresponding channel acts simultaneously as a select device in order to prevent overerasure.

The area of the coupling capacitor is designed for a coupling factor in the range of 36% to 63% to couple a high voltage onto the floating gate during programming so as to provide an enhanced CHEI at the "split point" in the channel region between the control gate and the floating gate. The programming voltage of 12 V does not have to deliver current and can thus easily be generated on-chip by a simple charge-pumping circuit.

The conflicting requirements for a high hot-electron generation and a high hot-electron gate current, which exist in conventional and split-gate devices, can be circumvented by inducing a high voltage (9 V) on the floating gate of the HIMOS structure. Under these bias conditions, the drain potential is basically extended by the inversion channel underneath this gate towards the split point between both gates. Now the control gate can be biased at the condition of maximum Channel Hot Electron generation ($V_{cg}$=1.5 V) and the total injected current is attracted to and collected on the floating gate.

By using this concept, one gains several orders of magnitude in programming current (and thus also in programming speed) for equal drain voltages, as compared to the conventional concepts.

In a 1.25 μm technology, the device is capable of being programmed in a few microseconds for a 5 V drain voltage and in a few milliseconds for a 3.3 V drain voltage. Scaling down the MIMOS device to sub-μm technologies further improves the programming speed. In a 0.7 μm technology the programming time is shown to decrease below 1 μm for 5 V drain voltage and in the order of 70 microseconds for 3.3 V at the drain, which programming is significantly faster than in 1.2 μm technology. When using the cell in a virtual ground array configuration, a cell area of 10 to 20 μm² can be obtained.

The main advantage of the HIMOS cell is therefore the fast 5 V-only (and 3.3 V-only) operation, but without the expense of a higher processing complexity.

For example, no additional channel implants are required to increase the CHEI efficiency, as in the case of EPROM or ETOX, and no buried injectors nor polysilicon spacers are needed as in the case of most SSI devices. It can be shown that the HIMOS programming current is only slightly dependent on the exact geometry of the cell, and depends only on the gate spacing at the "split point". The drain junction profile has no influence on the programming current. This is in contrast to the ETOX-cell, and to other split gate concepts, where the programming current shows a large dependence on the channel length of the cell and on the exact drain profile. Especially for the conventional split-gate concepts, this problem causes high sensitivity to misalignment problems and large dependency on process control, which is not the case for the HIMOS cell.

These unique features make the HIMOS cell particularly attractive for use in ASICs and embedded memory applications, where single supply voltage operation and CMOS compatibility are highly desired. But besides the 5 V-only operation, it does not have the disadvantages of the other cells, such as overerase and soft-write problems, trade-offs in drain profile engineering as for the split-gate cell with FN-erase, or the need for very high erase voltages and the low number of write/erase cycles as in the case of the split-gate cell with interpoly erase.

The cell read-out operation is performed by applying small read-out voltages to the control gate and the drain. As a consequence of the triple gate structure, a symmetrical threshold voltage window can be used, e.g. between −2 and +2 V. Therefore, during read-out, the program gate is simply kept grounded. In that case, a high current will be sensed if the threshold voltage is negative, while no current will be sensed if it is positive. The threshold voltage is thus sensed at the program gate and not at the control gate as is usually the case.

Because of the decoupling of the read-out and the write operations, a maximum allowable drain read-out voltage as high as 6.5 V is found for a soft-write lifetime of 10 years, which in practice corresponds to complete soft-write immunity.

The area penalty which is caused by the additional program gate can be largely removed by implementing the concept in a Virtual Ground Array (VGA) architecture, which results in a 15 μm² cell area (or less) for 0.7 μm technology.

The combination of the various advantages of the different alternative cell concepts into the HIMOS cell, together with the high compatibility with double poly CMOS processing and the additional advantages that are not offered by any of the other cell concepts makes the HIMOS cell into a promising candidate for embedded flash EEPROM memory applications.

DETAILED DESCRIPTION

Figure 1:
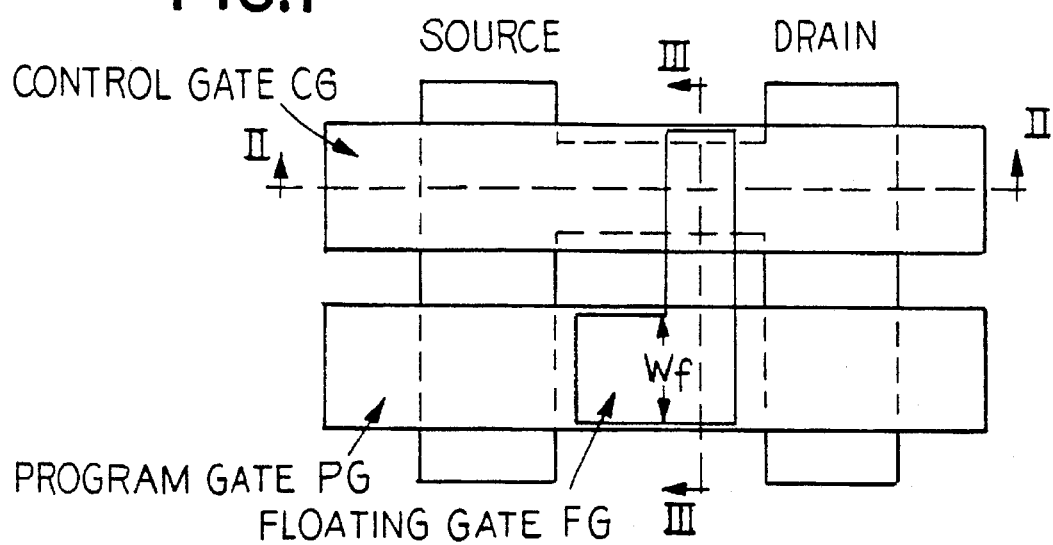
FIG. 1 is a schematic top view of an EEPROM cell structure according to the invention.
Figure 2:
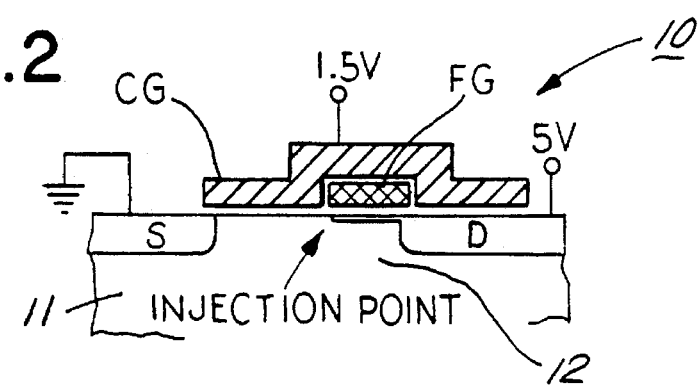
FIG. 2 is a sectional view along line II—II of FIG. 1.
Figure 3:
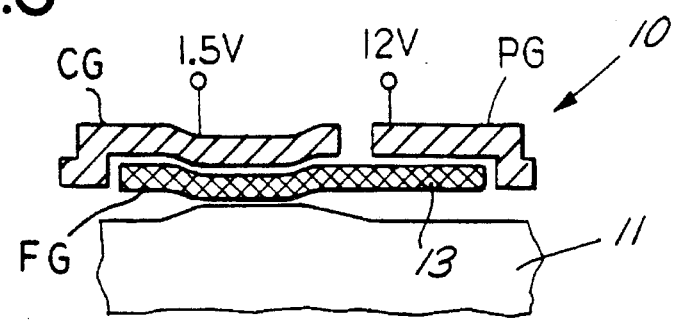
FIG. 3 is a sectional view along line III—III of FIG. 1.

Referring to FIGS. 1 to 3, the cell structure 10 according to the invention, referred to as the HIMOS cell, has a semiconductor substrate 11 with a source region S, a channel region 12 and a drain region D formed therein, and a floating gate FG made of a polysilicon layer. This floating gate extends over a portion or the channel region and is insulated therefrom by a thin tunnel oxide layer.

Also provided are a control gate CG and a program gate PG which are formed from a second polysilicon layer and have lateral edges facing each other in a spaced apart relationship. The control gate overlies the floating gate from above the source region to above the drain region through and is insulated therefrom by an interpoly oxide layer. In accordance with the invention the floating gate FG has an extension 13 insulated from the semiconductor substrate 11 by a dielectric layer.

The program gate PG is formed outside the active zone of the semiconductor substrate 11. The program gate PG overlies the extension of the floating gate FG and is insulated therefrom by the interpoly oxide layer so as to form an electric capacitor with said extension. The object of the program gate is to couple a voltage to the floating gate thereby programming the device through an enhanced electron injection mechanism.

Programming characteristics

Figure 4:
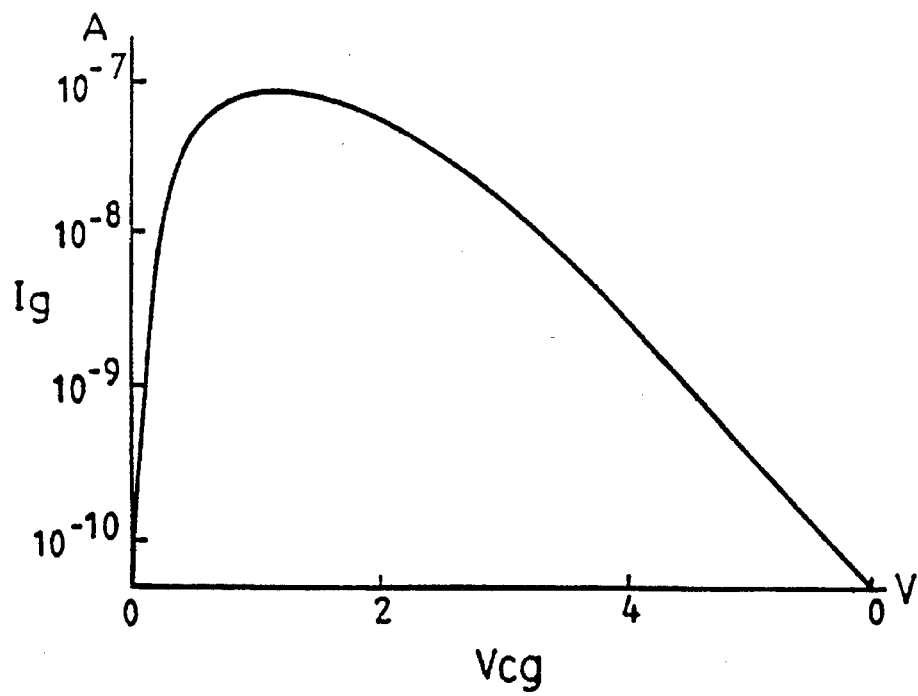
FIG. 4 is a plot of gate current as a function of control gate voltage.

Programming the device is achieved by applying a low voltage $V_{cg}$ to the control gate CG, a high voltage $V_{pg}$ to the program gate PG and a low voltage $V_d$ to the drain region. Typical voltage values according to the invention are $V_{cg}=1.2$ V, $V_{pg}=12$ V and $V_d=5$ V. The program gate PG thereby couples a high voltage onto the floating gate FG (e.g. a voltage of 9 V with the typical values shown above), which results in a very high hot-electron injection to be generated, toward the floater 9C gate FG at the split point (shown by the arrow in FIG. 2) in the channel region between the control gate CG and the floating gate FG. It is to be noted that high gate current can be obtained with a drain voltage of 5 V only. FIG. 4 shows the gate current $I_g$ measured for different control voltages $V_{cg}$. A current of 10 nA has been measured with the typical voltage values shown above. Thus, writing data in a memory cell according to the invention can be achieved within 1 µs. Fast programming is thereby provided without the need for an external voltage supply.

Figure 5:
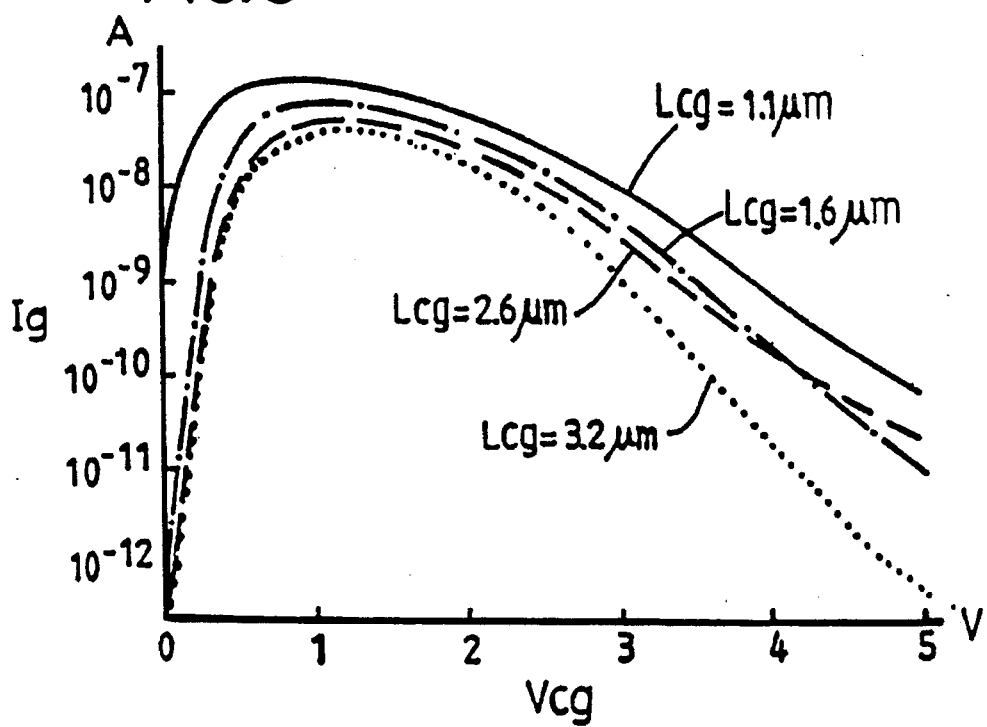
FIG. 5 is a plot of gate current as a function of control gate voltage for different channel lengths.

An advantage of the HIMOS cell according to this invention resides in that the gate current $I_g$ is weakly depending on the actual length of the transistor channel as illustrated in FIG. 5 which shows plots of gate current $I_g$ as a function of the control gate voltage $V_{cg}$ with different actual lengths for the transistor channel. As a result, the operation of the device is insensitive to manufacturing variations, which makes the device very interesting from the point of view of process control.

In accordance with the invention, the programming speed of the HIMOS device is related to the coupling factor between the program gate PG and the floating gate FG.

The programming time is defined as the time necessary to obtain a threshold-voltage shift from −3 V to +1 V.

Figure 6:
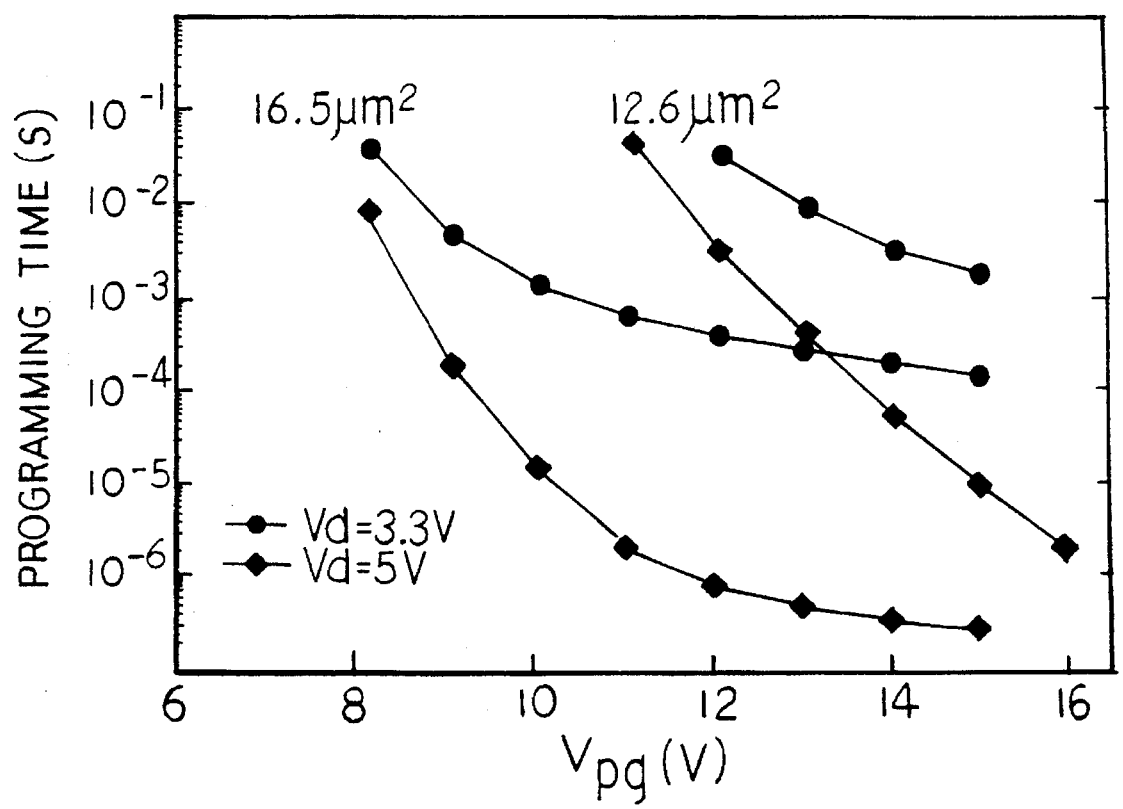
FIG. 6 shows the programming time as a function of program gate voltage.

FIG. 6 shows the programming time as a function of the program-gate voltage $V_{pg}$ for four different cases:

(1) a cell area of 12.6 µm² and a drain voltage of 3.3 V: the programming time shows to be in the millisecond range;
(2) a cell area of 12.6 µm² and a drain voltage of 5 V: the device enters the microsecond regime only as the gate voltage approaches 15 V;
(3) a cell area of 16.5 µm² and a drain voltage of 3.3 V: the programming time shows to be in the range of 100 µs;
(4) a cell area of 16.5 µm² and a drain voltage of 5 V: the programming time shows to be only a few hundreds of nanoseconds (700 ns for 12 V and 250 ns for 15 V).

The cell area was varied by changing the area of the program gate only; the rest of the cell was not altered. This implies that different cell areas can be unambiguously correlated to different coupling factors.

Figure 7:
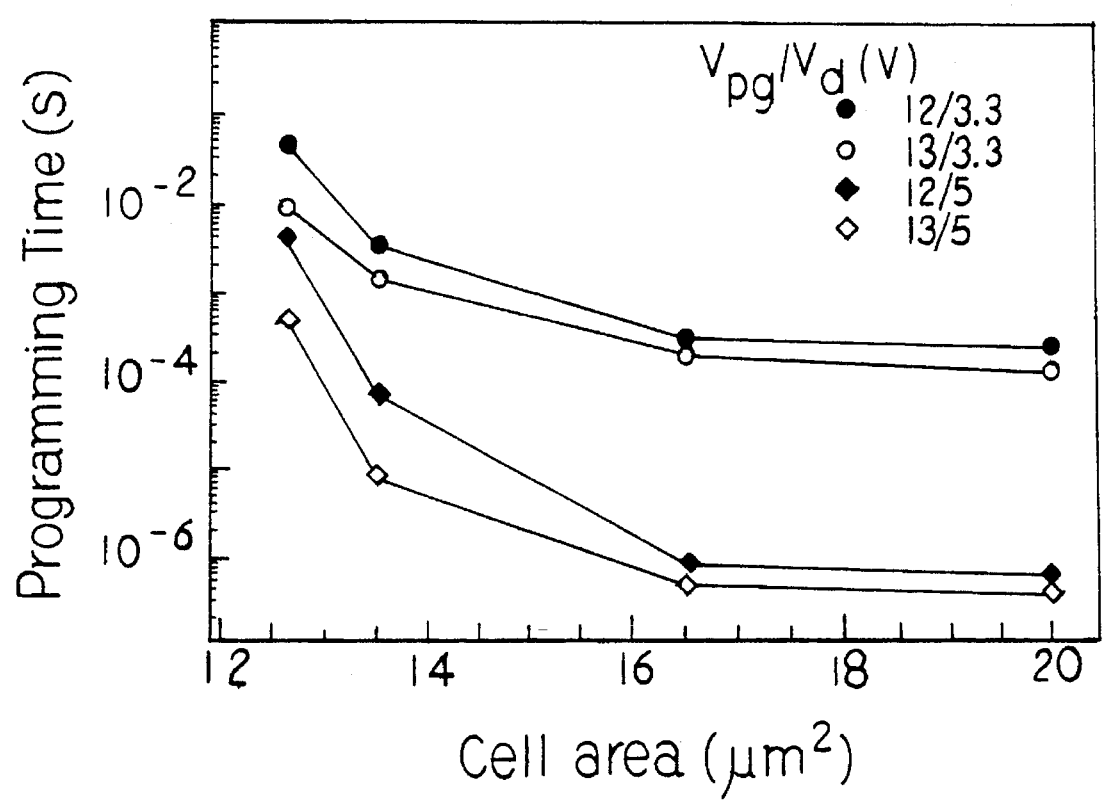
FIG. 7 shows the programming time as a function of the cell area for different program gate and drain voltages.
Figure 8:
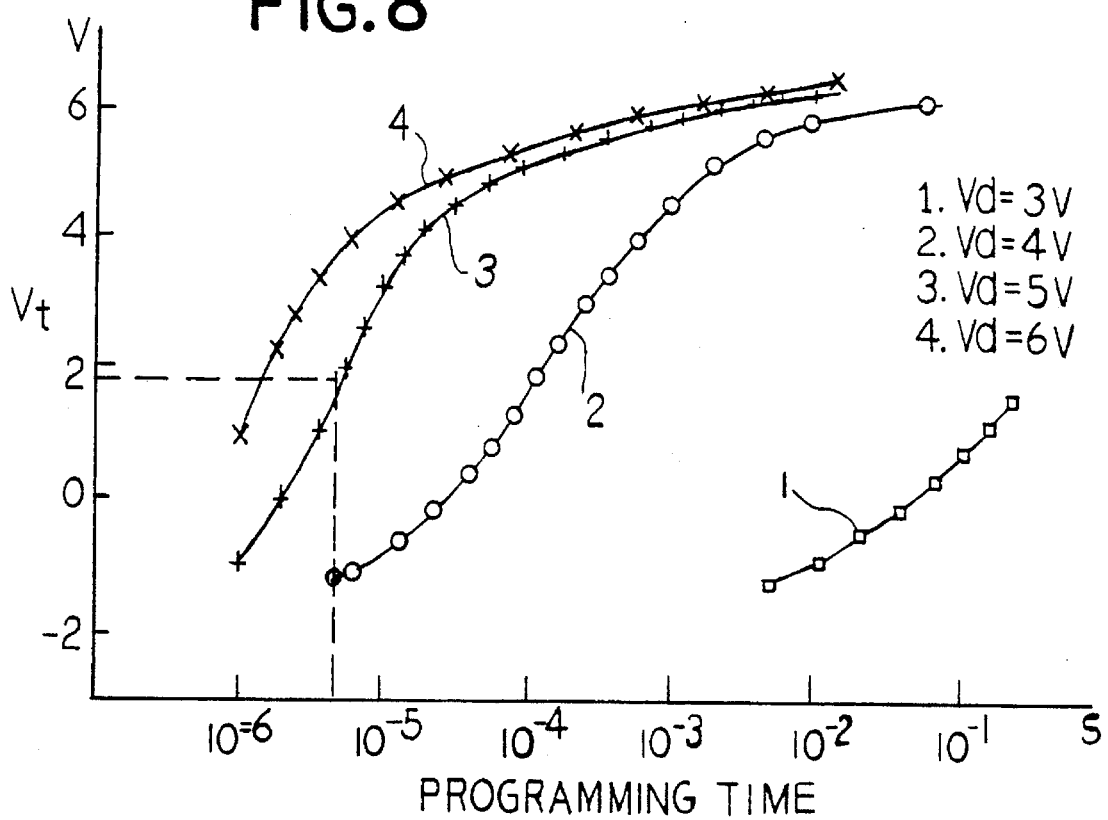
FIG. 8 shows the threshold voltage shift as a function of programming time.

FIG. 7 shows similar data but now the programming time is plotted directly as a function of the cell area for two gate voltages (12 and 13 V) and for two drain voltages (3.3 and 5 V). It can be seen that (for these gate voltages and for the current design) the very fast programming features can be obtained for cell areas of at least 15 µm². This implies that the coupling factor between the program gate PG and floating gate FG should be larger than a predefined value, in this case 50%.

As a matter of fact, a minimum cell area is required in order to 'trigger' the enhanced hot-electron injection mechanism in its most efficient way. The submicrosecond programming at a 5 V drain voltage has never been reported before.

The 16.5 µm² cell is only slightly slower than the 20 µm² cells since the smaller FG voltage at the start of the programming phase is compensated by the smaller charge transfer which is necessary to obtain the same threshold-voltage shift. The smallest devices (12.6 and 13.5 µm² respectively) however show a large increase in programming time because the FG channel enters the saturation regime which causes part of the potential drop to occur near the drain junction, as can be calculated from a capacitor model.

This phenomenon has been examined more extensively for the 12.6 µm² and the 16.5 µm² devices and the result is shown on FIG. 6. For a 15 V at the program gate and a 5 V drain voltage $V_d$, the smallest device again enters the microsecond regime. For the 16.5 µm² device, the programming speed is found to saturate around 200 ns, since for these high $V_{pg}$-values, the only gain in injection efficiency can still be expected from oxide barrier lowering, which is known to be a relatively small effect.

As can be seen on FIG. 6, a threshold-voltage shift of 4 V is already obtained in 200 ns for the case of a 20 µm² cell area ($V_d=5$ V and $V_{pg}=13$ V). For embedded memory applications, this is an acceptable cell area in state-of-the-art Flash technologies. Moreover, the feasibility of 3.3 V-only programming is also demonstrated: in this case the programming time is less than 100 µm.

The programming speed for a 3.3 V voltage is less sensitive to the applied program gate voltage $V_{pg}$ because the floating gate potential required to remain in the enhanced injection regime is smaller in this case. Therefore oxide barrier lowering dominates the programming speed in the major part of applied $V_{pg}$ values.

It is clear from FIGS. 6 and 7 that the memory cell can be optimized in terms of cell area, programming voltage and programming speed and since these parameters are interchangeable, a proper choice of these parameters depends on the particular application.

It should be noted that a further reduction of the cell area can not be accomplished by simply reducing the program gate area, since the device then moves out of the enhanced injection regime which drastically increases the programming time.

Figure 9:
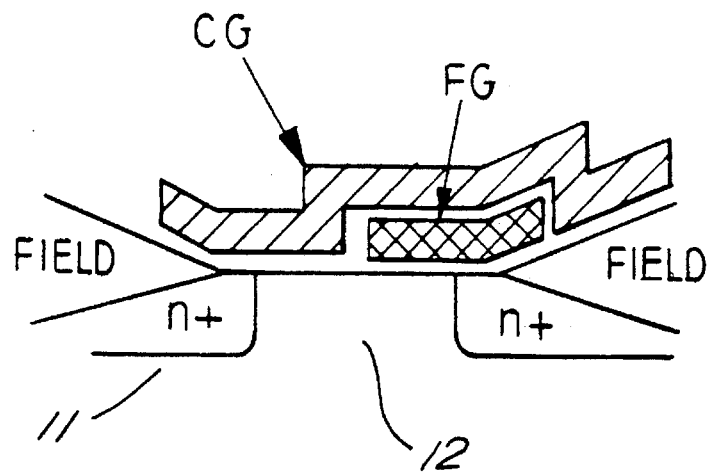
FIG. 9 is a sectional view of a variation of embodiment for the cell structure according to the invention.

An exemplary embodiment that overcomes this problem is depicted in FIG. 9. By defining the source and drain regions before the field oxide growth, buried junctions can be realized. The spacing between the different cells in an array can thus be strongly reduced without affecting the coupling factor of the memory cell. The smallest cell (currently 12.6 µm²) can be further reduced to 7.8 µm² by this modification. The faster cells (currently 16.5 µm²) can be reduced to 10.5 µm² which is very competitive for the considered 0.7 µm double poly CMOS technology. combining a very high programming efficiency with a high CMOS compatibbility causes an area penalty through the presence of the program gate PG. This penalty is fully characterized by the width $W_f$ of the PG. To minimize the additional area which is necessary for the PG, a virtual ground array VGA configuration has been chosen and the influence of the parameter $W_f$ is examined. Elaborate calculations based on the Lucky Electron Model, have already predicted that the programming time $T_p$ is only a weak function of $W_f$, as long as the PG channel stays in the linear regime. This can readily be explained by the weak dependence of the gate current on the FG voltage: when lowering the PG coupling factor, the decrease in gate current due to the smaller initial FG voltage is partially compensated by a corresponding decrease in the necessary charge transfer.

It is well known that the necessary charge transfer in order to establish a given threshold-voltage window becomes smaller for a smaller coupling capacitor. Normally, this effect is overruled by the exponential dependence of the gate current on the FG voltage. In the HIMOS device the relatively flat gate-current characteristic can be used to reduce the PG overhead.

Because of the strongly asymmetrical programming characteristics of the HIMOS device, the bitlines can be shared between adjacent bits in a row. The additional area for the PG can be reduced by sharing the Program Line between adjacent bytes. This is possible because of the triple gate structure of the device: the CG can be used as the wordline to access every byte separately during the write and read-out operations. The contactless array allows a minimal cell area which is strongly determined by the width $W_f$ of the program gate. Devices have been fabricated with $W_f$-values going from the minimum value of 0.7 µm up to 3.2 µm, which corresponds to cell areas of 12.6 to 20 µm². The corresponding PG coupling factors are in the range from 36% to 63%.

From the foregoing it is apparent that the cell structure of the invention offers many advantages over prior art nonvolative memory designs. To sum up, the invention provides a new structure which allows fast writing operations to be achieved using low drain voltage only, thus without needing an external voltage supply.

Since programming occurs with the control gate at a very low voltage close to the threshold voltage of the built-in select transistor, the drain current during programming is significantly reduced as compared to conventional devices, resulting in a reduction of power consumption and voltage drop along the bit lines during programming.

Another interesting feature of the HIMOS cell is the low sensitivity of the injection current on the effective channel length. In contrast to conventional CHE injection, the influence of the effective channel length on the gate current (and thus on programming speed) is linear rather than exponential, which strongly reduces the efforts necessary for a proper control of the channel length of the HIMOS structure as compared to other split-gate concepts.

During programming the CG voltage is very close to the threshold voltage of the built-in select device: the optimal $V_{cg}$-value is equal to 1 V for a 3.3 V drain voltage and equal to 1.5 V for a 5 V drain voltage.

Therefore, the drain current is a constant during the entire programming cycle, which ensures a constant supply of electrons for the hot-carrier generation process. This drain current is however also much smaller than in conventional devices where the optimal condition for hot-electron injection occurs at the onset of saturation ($V_{fg}=V_d$). The latter feature reduces bitline voltage drops and strongly decreases the necessary programming power, which offers the possibility of page-mode programming and of additional charge-pumping techniques for boosting the bitline voltage on chip, which is especially interesting in the case of 3.3 V-only operation.

FIG. 9 shows the threshold voltage shift $V_t$ as a function of programming time with a control gate voltage $V_{cg}$ of 1.4 V and a program gate voltage $V_{pg}$ of 12 V for different drain voltages $V_d$ as shown in the Figure. In the case of $V_d=5$ V, the threshold at the beginning of the programming phase is equal to $-2.33$ and that the threshold voltage window of 4 V is already obtained after 4 microseconds. This result has already been obtained in a 1.25 micron technology.

Read-out scheme and endurance characteristics

Reading out the device is achieved by applying a low voltage to the drain and to the program gate while keeping the control gate voltage $V_{cg}$ well above the threshold level. Since the program gate voltage is low, the enhanced electron injection mechanism is turned off thereby avoiding the soft write phenomenon during a read-out operation. This allows high read current to be obtained by a proper choice of the program gate voltage and thus higher read-out speed.

Since the threshold voltage of the memory cell is defined at the PG (for a constant CG voltage), the threshold-voltage window is positioned between $-3$ and $+1$ V, which implies that the logic memory content is determined by two distinct positive FG charge values. Therefore, during read-out the program gate is grounded while small voltages are applied to the drain and the control gate. It is interesting to mention that the window closure is entirely determined by the increase of the low threshold level, which justifies the above-mentioned read-out scheme. The advantage is that this positive charge will aid the electron injection during the entire programming cycle, effectively reducing the necessary externally applied PG voltage.

This feature cannot be exploited in conventional stacked-gate devices, because of the leakage currents caused by overerased devices. Split-gate devices are known to show an inherent immunity to overerase problems, but in a conventional split-gate configuration, this feature cannot be exploited in the same way as in the HIMOS device because the select device poses a lower limit to the low threshold-voltage level.

Further, the large drain and channel coupling will also contribute to the FG potential in a constructive way by the virtual drain effect.

Both effects allow either a strong reduction of the PG area, or a considerable reduction in PG voltage, depending on which parameter is to be optimized in a particular application. Table 1 gives a survey of typical HIMOS operating voltages under programming, erasing and read-out conditions. Notice that the programming operation is essentially performed in the CG channel (the FG channel then acts as a virtual drain junction), while the read-out operation is performed in the FG channel (the CG channel then acts as a virtual source junction). Therefore, the device exhibits a complete soft-write immunity.

It is to be noted that programming and erasing the device according to the invention occurs at different locations along the transistor channel, which improves the device endurance.

Figure 10:
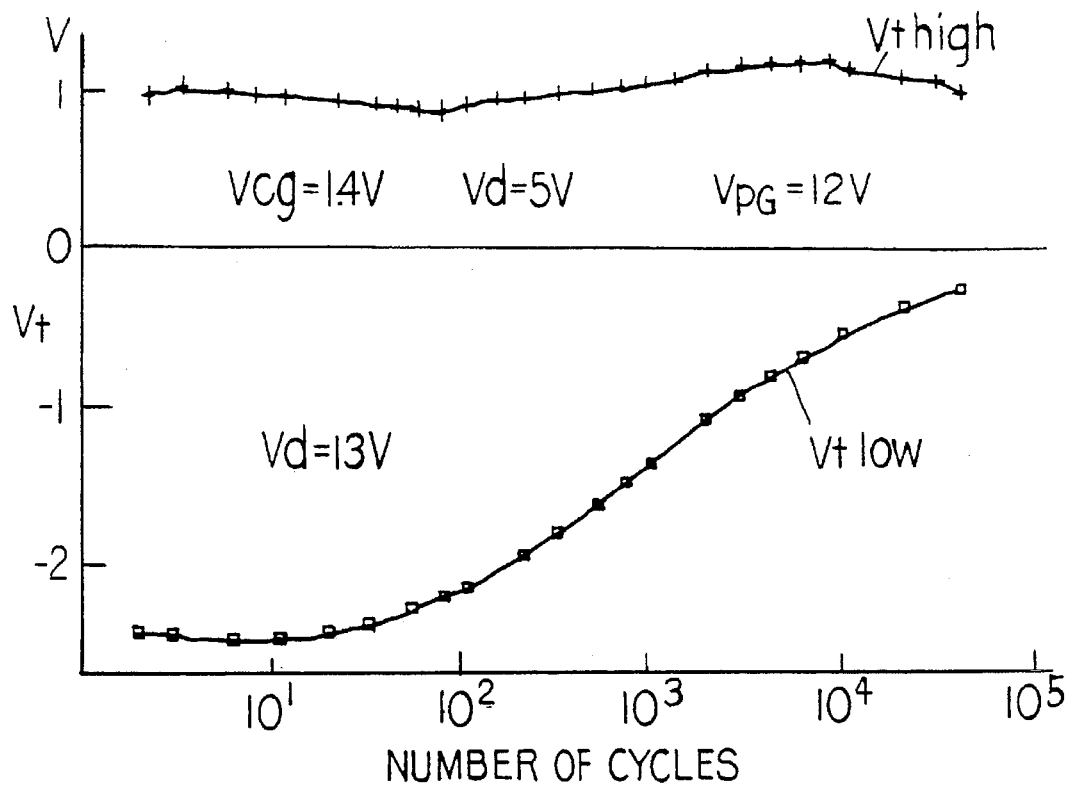
FIG. 10 shows the threshold voltage window as a function of the number of program/erase cycles.

FIG. 10 shows the threshold voltage window as a function of the number of program/erase cycles for exemplary devices with the operating conditions as shown in the Figure. The upper curve illustrates the high threshold level, the lower curve illustrates the low threshold level. It is seen that the high threshold level stays high during the entire test. This implies that the maximum number of cycles is determined by the low threshold level only.

Figure 11:
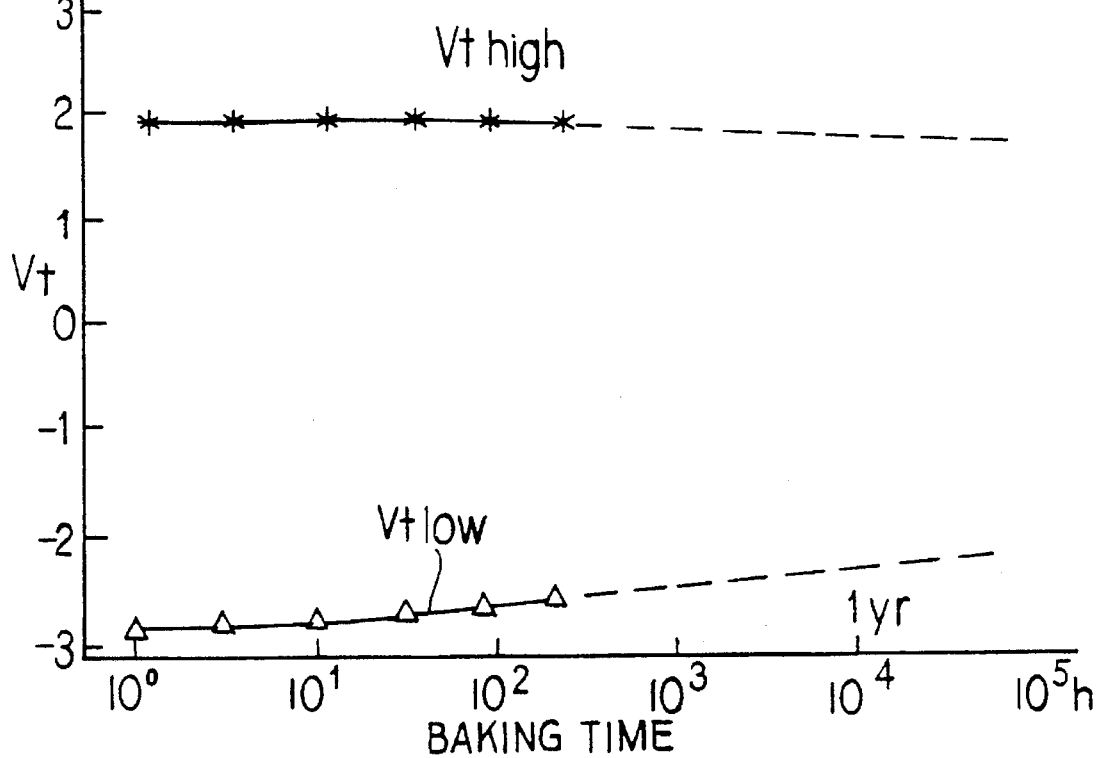
FIG. 11 shows the high and the low threshold levels as a function of time during a bake test at 300° C.

A further basic feature of a non-volatile memory device is the data retention, which is the ability for the device to retain the same information for a long period of time. FIG. 11 shows the high and low threshold levels of exemplary devices according to the invention as a function of time during a bake test at 300° C. The devices tested were unoptimized devices having a 8.2 nm tunnel oxide layer. The initial threshold voltage window was 4.75 V. wide. After 200 hours, the threshold voltage window was still 4.5 V wide. Extrapolating the curves towards the next decades shows an expected data retention time of at least 10 years at operating temperature.

Figure 12:
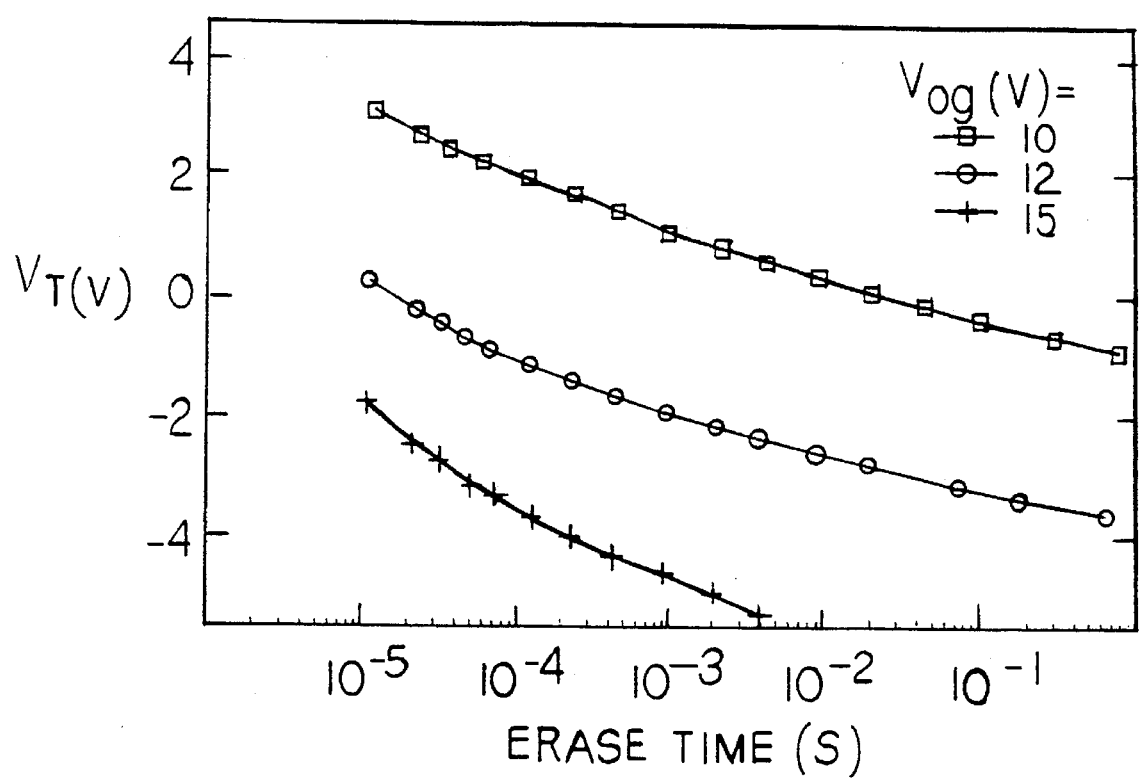
FIG. 12 shows the threshold voltage shift for various erase voltages at the control gate.

The possibility also exists for erasing the HIMOS device through the well-known polyoxide conduction mechanism. Since the coupling factor between the program gate and the floating gate is in the order of 50% or more, the coupling factor between the control gate and the floating gate is automatically minimized in a proper design. This means that a high control-gate voltage will create a high electric field in the polyoxide layer between the control gate and the floating gate. Because of the well-known field enhancement effect at the upper floating gate surface, this field becomes large enough to enable the electrons, stored on the floating gate, to tunnel through the polyoxide layer towards the control gate. FIG. 12 shows the transient characteristics for various erase voltages at the control gate CG. The device structure is essentially the same as in the structure described earlier herein apart from the tunnel oxide under the floating gate FG which can be replaced by a conventional gate oxide.

The main advantage of this embodiment is that the process for fabricating the device can be further simplified; there is no need for a thin oxide and also the deep (Phosphorous) drain junction can be replaced by a more conventional junction. Especially a version with buried junctions (see FIG. 9) becomes very attractive in this case; the alignment of the buried junctions onto the floating gate FG is no longer critical and the thicker gate oxide increases the coupling factor between the program gate PG and the floating gate FG for the same cell area, which allows a further decrease in cell area.

This yields a process flow which only contains one "non-volatile" module as compared to standard CMOS: the second gate oxide and polyoxide growth (performed at the same time) and the second polysilicon layer.

The main disadvantages of this approach are well-known from literature:
the programming speed will be somewhat smaller because of the lower oxide injection field under the floating gate FG;
the erase operation causes a high trapping of injected electrons inside the polyoxide layer which allows only 100 to 1000 cycles without adding special circuit techniques. This is however high enough for EPROM replacement, DIP-switches a.s.o.;
there are circuit techniques that can increase the number of cycles to 10,000 or even 100,000 but this happens at the expense of design complexity and higher erase voltages on chip.

In brief, however, the present invention offers the following advantages: (1) low program voltage at the drain junction and consequently no need for an external current supply for programming; (2) low cost manufacturing using standard CMOS technology; (3) fast programming as a result of the enhanced electron-injection mechanism; (4) programming current weakly dependent on the actual channel length; (5) high endurance of the device as a result of the fact that writing and erasing occur at different locations along the transistor channel; (6) soft writing of a cell is avoided during read-out, since the read-out operation is achieved with a low voltage at the program gate; (7) selective erasure can be achieved using a proper encoding scheme; (8) over-erasure can be achieved and thus a symmetric window can be used: higher read-out and write speed and a quasi-zero voltage at the program gate; and (9) simple implementation for the drain junction since the write speed is not defined by the junction and/or channel profile.

It is to be understood that the invention is not limited to the embodiment described in the foregoing and that modifications may be made without departing from the scope of the invention, as defined by the following claims.

We claim:

1. A programmable EEPROM cell structure for use as an erasable programmable semiconductor memory device, comprising:

a semiconductor substrate including a source region, a drain region and a channel extending between said source and drain regions, with a drain voltage between said source and drain regions;

a floating gate extending over a portion of the channel with a thin oxide layer therebetween;

a control gate extending over a portion of said floating gate from above said source region to above said drain region through a dielectric oxide layer; and a program gate extending above said floating gate with a dielectric oxide layer therebetween, said program gate forming a capacitor with said floating gate with a coupling ratio sufficient to couple a voltage at least as high as said drain voltage to said floating gate, thereby establishing a high voltage at a point in said channel between said control gate and said floating gate and ensuring a high hot-electron injection towards said floating gate.

2. A structure as claimed in claim 1 wherein said floating gate includes a first portion extending from below said control gate to below said program gate.

3. A structure as claimed in claim 2 wherein said coupling ratio is at least 50%.

* * * * *